United States Patent [19]

Bate et al.

[11] 4,072,977
[45] Feb. 7, 1978

[54] READ ONLY MEMORY UTILIZING CHARGE COUPLED DEVICE STRUCTURES

[75] Inventors: Robert T. Bate, Richardson; John Millard Caywood, Dallas, both of Tex.

[73] Assignee: Texas Instruments Incorporated, Dallas, Tex.

[21] Appl. No.: 703,736

[22] Filed: July 9, 1976

Related U.S. Application Data

[63] Continuation of Ser. No. 497,162, Aug. 13, 1974, abandoned.

[51] Int. Cl.² ............................................. H01L 29/78
[52] U.S. Cl. ........................................ 357/24; 357/14; 357/68; 307/221 D
[58] Field of Search ........................... 357/24, 14, 68; 307/221 D

[56] References Cited

U.S. PATENT DOCUMENTS

| | | | |
|---|---|---|---|
| 3,654,499 | 4/1972 | Smith | 357/24 |
| 3,795,847 | 3/1974 | Engeler et al. | 357/24 |
| 3,806,772 | 4/1974 | Early | 357/24 |
| 3,811,055 | 5/1974 | Weimer | 357/24 |
| 3,863,065 | 1/1975 | Kosonocky et al. | 357/24 |
| 3,864,722 | 2/1975 | Carnes | 357/24 |
| 3,876,952 | 4/1975 | Weimer | 357/24 |
| 3,877,056 | 4/1975 | Bailey | 357/24 |
| 3,911,467 | 10/1975 | Levine et al. | 357/24 |

OTHER PUBLICATIONS

J. Tartamella, "Control-Charged Device Shift Register," IBM Tech. Discl. Bull., vol. 15, #5, Oct. 1972, p. 1461.

D. Collins et al., "Analog Matched Filters Using Charge Coupled Devices, " Nerem 72 Record, vol. 14, L.C. #61-3749, Nov. 72, pp. 165-167.

P. Richman, "MOS Field Effect Transistors and Integrated Circuits," Wiley-Interscience, 1973, pp. 56-63, and attachment.

*Primary Examiner*—Stanley D. Miller, Jr.
*Assistant Examiner*—Joseph E. Clawson, Jr.
*Attorney, Agent, or Firm*—James T. Comfort; Charles J. Fassbender

[57] ABSTRACT

The specification discloses a read only memory constructed from a charge coupled device having a channel for storage of charges in bit regions defined along the channel. Various structures are disclosed for storing combinations of two different levels of charge in the bit regions. In one embodiment, storage gates which communicate at spaced points along the length of the CCD channel are provided with different widths to control the level of charge input by the storage gates to the channel bit regions. In alternate embodiments, the semiconductor doping or oxide thickness of the storage gates are controlled in order to cause different levels of charge to be stored in the channel gate bit regions. After storage of the different charge levels in the channel, phase electrodes which span the channel are operated to serially output the charge levels from the channel to provide a predetermined digital word.

7 Claims, 8 Drawing Figures

READ ONLY MEMORY UTILIZING CHARGE COUPLED DEVICE STRUCTURES

This is a continuation of application Ser. No. 497,162, filed Aug. 13, 1974 now abandoned.

This invention relates to semiconductor devices, and more particularly relates to read only memories constructed from charge coupled device structure.

Read only memories (ROMs) are commonly used in electronic applications wherein information is required to be permanently stored for reference. For example, ROMs are utilized in look-up tables for calculators, as character generators and as hardware arithmetic units for computers. However, previously developed ROMs have not been completely satisfactory with respect to size and simplicity and economy of fabrication and programming.

In accordance with the present invention, a read only memory is constructed from a charge coupled device having a channel for storage of charges at bit regions defined along the channel. Circuitry stores a predetermined pattern of two different levels of charge in the bit regions. Phase electrodes which span the channel are operated to control the serial output of the pattern of charge levels from the channel to provide a predetermined digital word.

In accordance with another aspect of the invention, a read only memory includes a charge coupled device including a channel with bit regions for storing charges. A plurality of storage gates are disposed at spaced locations along the channel and communicate with the bit regions. A first set of the storage gates have narrow widths and a second set of the storage gates have wide widths. Input circuitry is coupled to the storage gates for receiving an input voltage. A transfer electrode is disposed adjacent the storage gates and is operable to transfer charge from the input circuitry to the storage gates, wherein the first set of storage gates store less charge than the second set of storage gates. Gate circuitry transfers the charges from the storage gates to the bit regions in the channel. Phase electrodes span the channel and are operable to serially transfer the charges from the bit regions to provide an output digital signal corresponding to the arrangement of the first and second bits of storage gates.

In accordance with yet another aspect of the invention, a method of operating a charge coupled device as a read only memory includes applying an input voltage to the parallel input of the charge coupled device. Different levels of charge are transferred from the parallel input to the bit regions of the channel of the charge coupled device in order to store a predetermined digital word in the channel. The digital word is then serially output from the output of the channel upon demand.

For a more complete understanding of the present invention and for further objects and advantages thereof, reference is now made to the following description taken in conjunction with the accompanying drawings, in which.

Figure 1:
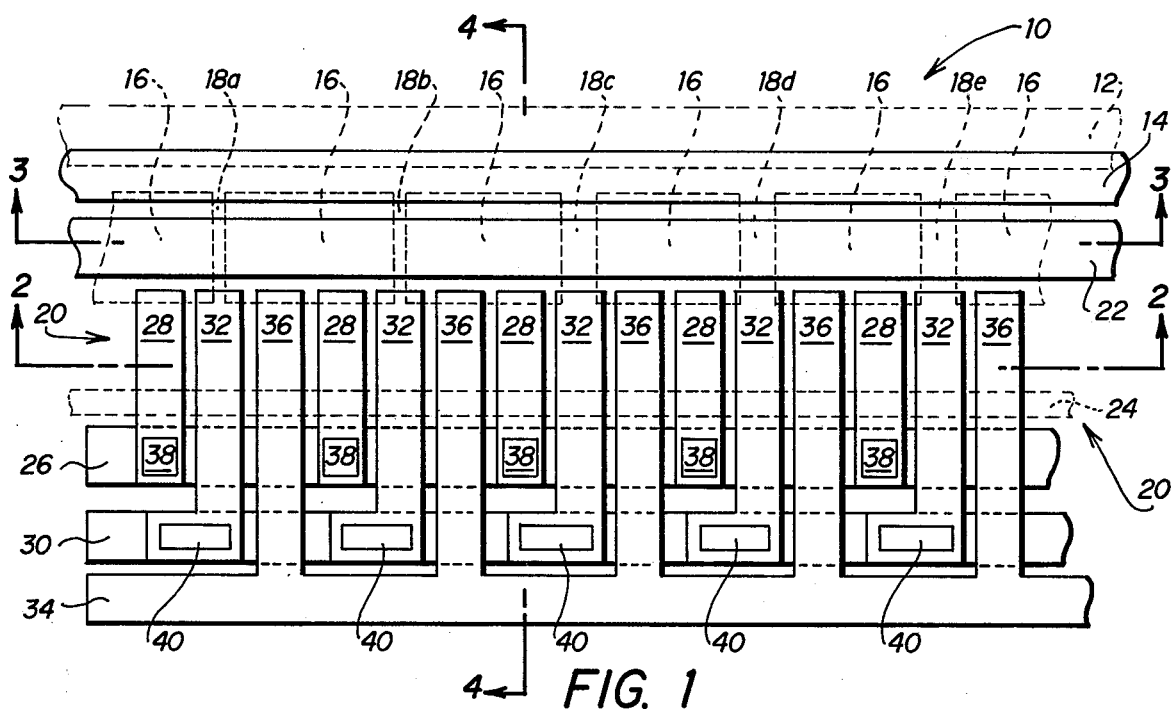
FIG. 1 is a top view of a three phase charge coupled device read only memory according to the invention.

Referring to FIG. 1, a read only a-(ROM) formed on a semiconductor body 10 according to the invention is illustrated. An elongated input diode 12 is formed in the semiconductor body to receive a predetermined input voltage. A transfer gate bus 14 is formed over the semiconductor body in order to receive transfer gate pulses from suitable control circuitry. A plurality of rectangular channel stops 16 are defined in the semiconductor body to define storage gates or channel inputs 18a–e. The storage gates 18l–e communicate with a charge coupled device channel 20 which extends parallel to the input diode 12 and which is defined by the edges of the channel stops 16. An important aspect of the invention is that storage gates 18a–b are narrow, while storage gates 18c–e are relatively wide. A transfer gate bus 22 is formed over the channel stops in the conventional manner and is operable to receive transfer gate signals to transfer charges from the storage gates to channel 20. The other side of the channel 20 is defined by an elongated channel stop 24 formed in the semiconductor body.

A first phase or clock bus 26 is formed parallel to the channel 20 and includes first phase electrodes 28 which span the channel 20 in the conventional manner. A second clock bus 30 is disposed parallel to bus 26 and includes second phase electrodes 32 which span the channel 20. A third clock bus 34 is disposed parallel to bus 30 and includes third phase electrodes 36 which span the channel 20 to provide a three phase charge coupled device. Via holes 38 extend through insulating layers of the device to contact the bus 26 with the phase electrodes 28. Via holes 40 provide interconnection between the clock bus 30 and the phase electrodes 32.

Figure 2:
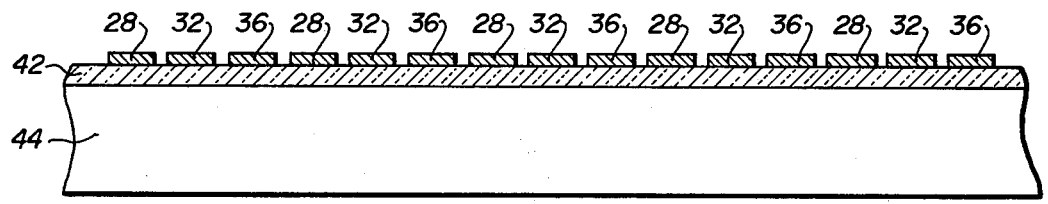
FIG. 2 is a cross sectional view of the device shown in FIG. 1 taken generally along the section lines 2—2.

FIG. 2 is a cross section of the present device taken along section lines 2—2 and illustrating the formation of the phase electrodes 28, 32 and 36 over an oxide layer 42. Oxide layer 42 is formed over the silicon body 44 from which the device is initially fabricated. While it will be understood that the present device may be formed from various types of semiconductor materials, in the preferred embodiment it will be assumed that the silicon body 44 comprises a P-type substrate. The electrodes 28, 32 and 36 may be formed by any conventional manner such as by deposition of aluminum and patterning according to conventional photolithographical techniques. The sequential application of clock pulses to the electrodes 28, 32 and 36 causes charge packets to be serially moved along channel 20 in the well known manner.

Figure 3:
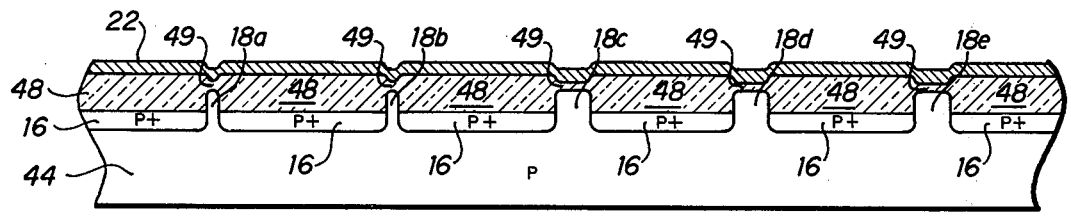
FIG. 3 is a sectional view of the device shown in FIG. 1 taken generally along the section lines 3—3.

FIG. 3 illustrates a sectional view of the device shown in FIG. 1 taken along section lines 3—3. The P-type substrate 44 has formed therein p+ channel stops 16 which operate to define the storage gates 18a–e. As previously noted the storage gates 18a and 18b are narrow, wherein the storage gates 18c–e are relatively wide. In the preferred embodiment, the storage gates 18a and 18b are one-third the width of the storage gates 18c-e. Oxide regions 48 are formed over each of the channel stops 16. The narrow oxide bridges 49 which join the oxide regions 48 are provided with the width of approximately 1,000 A, while the depth of the oxide regions 48 are, for example, approximately 5,000 A. The storage gate bus 22 may be formed from aluminum and extends over the channel stops and storage gates in the illustrated manner.

Figure 4:
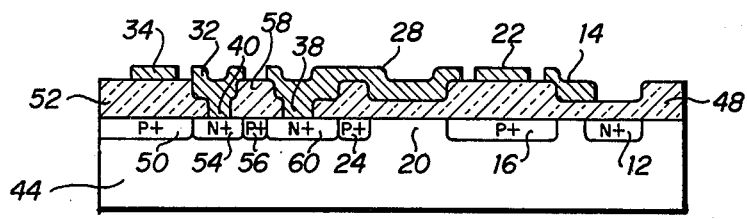
FIG. 4 is a sectional view of FIG. 1 taken generally along the section lines 4—4.

FIG. 4 illustrates a sectional view of the device shown in FIG. 1, taken generally along the section lines 4—4. The P-type body 44 includes a P+ region 50 disposed beneath an oxide layer 52 and the clock bus 34. The phase electrode 32 and via hole 40 interconnect with an N+ region 54. The P+ region 56 is covered by an oxide layer 58. An N+ region 60 is contacted through the via hole 38 by the phase electrode 28 which extends across the channel 20. Channel 20 is defined by the P+ channel stop 24 and the P+ channel stop 16 which is covered by the oxide layer 48 in the manner shown in FIG. 3. The N+ input diode 12 is disposed beneath the oxide layer 48 and the transfer bus 14.

In operation of the ROM shown in FIGS. 1-4, the storage gates 18a-e are provided with a predetermined pattern of different widths in order that the charges stored therein will be provided with a pattern of two different levels. For example, the storage gates 18a-b will store substantially lower charges than the wider storage gates 18c-e. The widths of the storage gates will be configured according to the desired digital word to be output by the ROM. In the illustrated example, the desired word is 00111, with the storage gates 18a-b providing the logic zeroes and the storage gates 18c-e providing the logic ones.

In operation of the device shown in FIGS. 1-4, a predetermined voltage is applied to the input diode 12. When it is desired to load the ROM, the transfer gate bus 14 is biased while the storage gate bus 22 is biased into deep depletion in order to allow current to flow from the input diode 12 to the storage gates 18a-e. The areas where there are no channel stops 16 will become completely inverted. The transfer gate bus 14 is then turned off and the storage gates store a charge depending upon their width. As previously noted, storage gates 18a-b store relatively low charges (logic zeroes), while storage gates 18c-e store relatively high charges (logic ones).

The transfer gate bus 14 is then turned off and the phase two electrodes 32 are biased into deep depletion, thereby causing the charges in the storage gates 18a-e to transfer to bit regions in the channel 20 underneath the phase two electrodes 32. The storage gate bus 22 is then turned off and the phase electrodes 28, 32 and 36 are pulsed by clock pulses in the normal charge coupled device fashion in order to shift the stored digital word from the channel 20 in a serial manner. Thus, the digital word 00111 will be output from the channel 20 to provide a read only memory output. It will of course be understood that the width of the storage gates 18a-e may be changed in fabrication in order to program different digital words within the ROM.

Figure 8:
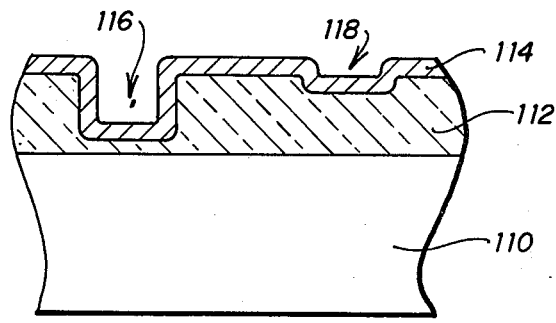
FIG. 8 is a sectional view of a third embodiment of the invention utilizing various thicknesses of oxide for programming of the read only memory according to the invention.

It will also be understood that storage gates 18a-e could be provided with equal widths and the charge stored therein varied by depositing different thicknesses of oxide over the top thereof, as illustrated in FIG. 8. Alternatively, the storage gates 18a-e may be doped with two different doping levels in order to vary the amount of charge stored therein in order to provide the ROM function of the present invention.

Figure 5:
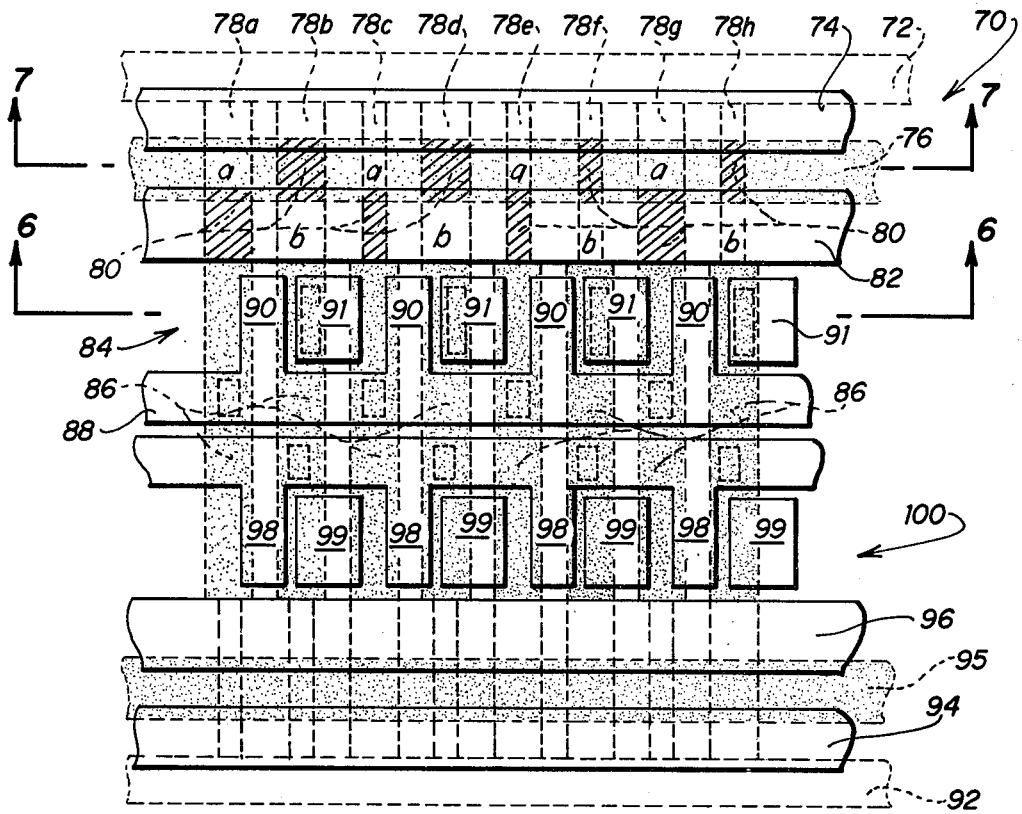
FIG. 5 is a top view of a two phase read only memory device constructed in accordance with the present invention.
Figure 6:
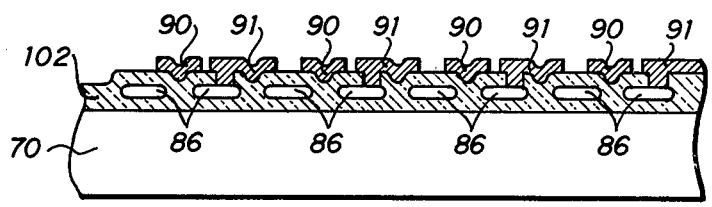
FIG. 6 is a sectional view of the device shown in FIG. 5 taken generally along the section lines 6—6.
Figure 7:
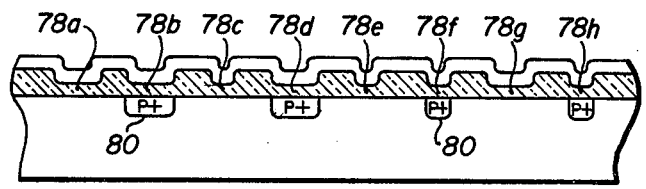
FIG. 7 is a sectional view of the device shown in FIG. 5 taken generally along the section lines 7—7.

FIGS. 5-7 illustrate another ROM constructed from a P channel, two phase silicon gate double level charge coupled device. It will be understood that other types of CCD configurations can also be used with the present invention.

Referring to FIG. 5, a silicon substrate 70 has formed therein an input diode 72, with a bus 74 formed thereover. A silicon gate 76 is formed parallel to the input diode 72. Thin oxide channel regions 78a-h are formed in the body, with regions 78a, 78b, 78d and 78g being provided with relatively wide widths, and regions 78c, 78e, 78f and 78h being provided with relatively narrow regions. A charge storage bus 82 is formed parallel to the bus 74. P+ buses 80 are formed where regions 78a, 78c, 78e, 78g . . . intersect charge storage bus 82, and where regions 78b, 78d, 78f, 78h . . . intersect silicon gate 76. Thus, the buses 80 have a width corresponding to the regions 78a-h; and they alternate from bus 82 to gate 76. A charge coupled device channel 84 is defined parallel to the bus 82 and is spanned by a series of silicon gates 86 formed in the conventional two phase silicon gate double layer technique. A first clock bus 88 is defined adjacent one side of the channel 84 and includes a plurality of phase electrodes 90 which span the channel 84. Second phase electrodes 91 span channel 84 and are connected through via holes to ones of the silicon gates 86. A first series of gate storage regions "a" is thus formed between the buses 74 and 82, while a second set of gate storage regions "b" is disposed beneath the bus 82. Selective operation of the buses of the invention thus enable transfer to the CCD channel through either set of "a" or "b" of the gate storage regions.

A second CCD device is also formed on the semiconductor body as a mirror image of the CCD device previously described. The second device includes an input diode 92, a transfer bus 94 and a gate storage bus 96 and phase electrodes 98 and 99 which span a CCD channel 100 formed in the manner previously described.

FIG. 6 is a sectional view of the device shown in FIG. 5 taken along the section lines 6—6 and illustrates the silicon body 70 and the oxide layer 102 which insulates the silicon gates 86 in the conventional manner. The phase electrodes 90 are isolated from the silicon gates 86, while phase electrodes 91 extend through via holes into contact with ones of the gate 86.

FIG. 7 is a sectional view of the device shown in FIG. 5 taken generally along the section lines 7—7. As shown in FIG. 7, the body 70 includes a plurality of P+ buses 80 formed within the substrate. The storage gates 78a through 78h are defined by the oxide layer 102, with the storage gates 78a, 78b, 78d and 78g being much wider than the storge gates 78c, 78e, 78f and 78h. The polysilicon conductor 76 is disposed over the oxide layer 102 in the manner illustrated.

The construction and operation of P channel two phase silicon gate charge coupled devices is well-known, and for a more complete description of the construction and operation of such a device, reference is made to the article entitled "Two-Phase Charge-Coupled Devices with Overlapping Polysilicon and Aluminum Gates" by W. F. Kosonocky et al, R.C.A. Review, Vol. 34, March 1973, pages 164-202. An important aspect of the present device shown in FIGS. 5-7 is that the storage gates of the invention are configured with varying widths, such that the charges stored in the channels 84 and 100 are varied according to predetermined digital words.

Operation of the ROM shown in FIGS. 5-7 will be described with respect to only the upper CCD device. A predetermined voltage is applied to the input diodes 72.

The bus 74 and either gate storage "a" or "b" are turned on to load either the storage gates "a" or "b." The transfer gate 74 is then turned off. The phase buses 88 are then sequentially clocked. If the storage gate "a" were loaded, charge packets will be transferred to the horizontal channel 84 at phase one electrodes 90. The word coded in this example would thus be 1001. After transfer of the charges, the register "a" goes off. If the storage gate "b" is loaded, then charge packets are transferred to the horizontal channel 84 on phase two. After phase two, the gate storage "b" goes off. The word coded in channel 84 in this example is 1100.

The second horizontal transfer CCD register comprising the lower half of the circuit shown in FIG. 5 has been laid out sharing the phase driver lines with the upper horizontal register. For convenience, these registers have been coded in the drawings as the "ones" complement of the upper registers.

An important aspect of the circuit shown in FIGS. 5-7 is the compactness of the design. The layout shown in FIG. 5 utilizes approximately 1.7 mils$^2$ per bit. The area per bit can be reduced to 1.4 mils$^2$ per bit by narrowing the input diode bus, the horizontal channel, gates $a$ and $b$ and the transfer electrode by 0.1 mil each. It would also be possible to double the density of this layout by utilizing a quadrunary rather than a binary code with the utilization of more complicated output circuitry.

FIG. 8 is a cross sectional view of a storage gate area of a CCD device wherein varying layers of oxide thickness are provided. As shown in FIG. 8, a silicon body 110 has formed thereover an oxide layer 112. A conductor layer 114 is disposed over the oxide layer. The conductor layer 114 may comprise either polysilicon or aluminum. An important aspect of the embodiment shown in FIG. 8 is that the gate storage area illustrated by the arrow 116 is provided with a very thin thickness of oxide, while the gate storage area 118 is provided with a relatively thick layer of oxide. Thus, the charge stored beneath the gate storage area 116 will be substantially greater than the charge stored beneath the gate storage area 118. The charge stored beneath gate area 116 would thus comprise a logic 1, while the charge stored beneath the gate storage area 118 would comprise a logic 0. The charges stored in the gate storage areas may then be transferred to a CCD channel in the manner previously described in order to provide the desired ROM function. The varying layers of oxide may be provided by conventional etching steps or by extra deposition of oxide.

In addition, ROM coding may be provided in gate storage areas similar to that shown in FIG. 8, but with equal thicknesses of oxide thereover. However, the gate storage areas would be doped with different semiconductor doping in order to provide the ROM coding. For example, to provide a logic 0, the gate storage area would be doped with phosphorous for a P channel device. To provide a logic 0 for an N channel device, the gate storage area would be coped with boron.

It will thus be seen that the present invention provides for the utilization of charge coupled device structure to provide read only memory functions. The present ROMs utilize conventional easy-to-fabricate CCD structures, such that for the same voltage applied, various bits of the CCD will be provided with diffferent charge holding capacities. By varying these different charge holding capacities, predetermined digital words may be stored in the CCD structure and then selectively read out to provide predetermined digital words in a ROM function.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A read only memory comprising a charge coupled device shift register having a semiconductor substrate defining a channel overlaid by phase electrodes spanned and insulated from said channel for serial propagation along toward an output end of said channel of charge packets introduced in said channel; said shift register having a plurality of stages each defined by a plurality of adjacent phase electrodes; charge source means spaced from and extending lengthwise of said channel; first charge storage means including first respective charge storage regions defined between said charge source means and a first phase electrode of each of said stages, said first respective charge storage regions being arranged in a first predetermined pattern of different charge storage capacities; second charge storage means including second respective charge storage regions defined between said charge source means and a second phase electrode of each of said stages, said second respective charge storage regions being arranged in a second predetermined pattern of different charge storage capacities; said first and second charge storage means also including first and second storage gate means respectively; said first storage gate means overlying and insulated from said first storage regions, said second storage gate means overlying and insulated from said second storage regions; transfer gate means insulated from said substrate; said transfer gate means and said first storage gate means together enabling simultaneous transfer of charge from said charge source means to said first charge storage regions, said transfer gate means and said second storage gate means together enabling simultaneous transfer of charge from said charge source means to said second charge storage regions; said first storage gate means and said first phase electrodes together enabling subsequent simultaneous transfer of said charge packets from said first storage regions to said channel beneath corresponding ones of said first phase electrodes, said second storage gate means and said second phase electrodes together enabling subsequent simultaneous transfer of said charge packets from said second storage region into said channel beneath corresponding ones of said second phase electrodes.

2. A read only memory according to claim 1 wherein said first charge storage means includes respective semiconductor dopants in said semiconductor substrate extending from under said first phase electrode to said first charge storage regions; and said second charge storage means includes respective second semiconductor dopants in said semiconductor substrate extending from said second charge storage regions to under said transfer gate means.

3. A read only memory according to claim 1 wherein predetermined ones of said first and second charge storage regions have a first charge storage capacity corresponding to a logic 0 level, and the remainder of said first and second charge storage regions each have a second charge storage capacity corresponding to a logic 1 level, such that two predetermined binary digit words may be selectively produced at the outpiut of said channel.

4. A read only memory according to claim 1 wherein said charge stoage regions have identical widths and are overlaid by portions of said insulating layer having different respective thickensses.

5. A read only memory according to claim 1 wherein said charge storage regions have different respective widths and are overlaid by portions of said insulating layer having a uniform thickness.

6. A read only memory according to claim 1 wherein said transfer gate means comprises a transfer electrode, said first storage gate means comprises a first storage gate electrode, and said second storage gate means comprises a second storage gate electrode; said first storage gate electrode being common and overlying all of said first charge storage regions, said second storage electrode being common to and overlying all of said second charge storage regions, and said transfer electrode overlying said substrate between said charge source means and said first storage gate electrode.

7. A read only memory according to claim 1 wherein said charge source means comprises a single input diode means defined in said substrate and extending parallel to said channel.

* * * * *